US011508663B2

(12) United States Patent
Azeroual et al.

(10) Patent No.: US 11,508,663 B2
(45) Date of Patent: Nov. 22, 2022

(54) PCB MODULE ON PACKAGE

(71) Applicant: MARVELL ISRAEL (M.I.S.L) LTD., Yokneam (IL)

(72) Inventors: Dan Azeroual, Kiriat Ata (IL); Eldad Bar-Lev, Kiryat Tivon (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 0 days.

(21) Appl. No.: 16/260,732

(22) Filed: Jan. 29, 2019

(65) Prior Publication Data

US 2019/0244903 A1    Aug. 8, 2019

Related U.S. Application Data

(60) Provisional application No. 62/625,808, filed on Feb. 2, 2018.

(51) Int. Cl.
*H05K 7/00* (2006.01)
*H01L 23/538* (2006.01)
*H05K 1/02* (2006.01)
*H01L 23/31* (2006.01)
(Continued)

(52) U.S. Cl.
CPC ...... *H01L 23/5383* (2013.01); *H01L 23/3114* (2013.01); *H05K 1/0298* (2013.01); *H05K 1/115* (2013.01); *H05K 1/181* (2013.01)

(58) Field of Classification Search
CPC ............ H01L 23/5383; H01L 23/3114; H01L 23/49811; H01L 23/49838; H01L 23/3128; H05K 1/0298; H05K 1/115; H05K 1/181; H05K 2201/0311; H05K 1/141; H05K 2201/2036; H05K 3/368; H05K 2201/10734; H05K 2201/042;
(Continued)

(56) References Cited

U.S. PATENT DOCUMENTS 6,366,467 B1 * 4/2002 Patel ..................... H05K 1/141
257/691
6,884,086 B1 * 4/2005 Ruttan ................. H05K 7/1092
439/66
(Continued)

FOREIGN PATENT DOCUMENTS

EP           3442314 A1      2/2019

OTHER PUBLICATIONS

Office Action in Taiwan Patent Application No. 108103745, dated Jul. 16, 2020, with English translation (9 pages).
(Continued)

*Primary Examiner* — Binh B Tran

(57) ABSTRACT

Aspects of the disclosure provide a printed circuit board (PCB) system that includes an integrated circuit (IC) package, a first PCB and a PCB module. The IC package has a package substrate and an IC chip that is coupled to a top surface of the package substrate. The first PCB is configured to electrically couple with first contact structures that are disposed on a bottom surface of the package substrate. The PCB module includes a second PCB and one or more electronic components electrically coupled to the second PCB. The PCB module is configured to electrically couple with second contact structures that are disposed on the top surface of the package substrate.

20 Claims, 4 Drawing Sheets

(51) Int. Cl.
  *H05K 1/11* (2006.01)
  *H05K 1/18* (2006.01)
(58) Field of Classification Search
  CPC .. H05K 2201/10409; H05K 1/11; H05K 1/14; H05K 1/144
  See application file for complete search history.

(56) References Cited

U.S. PATENT DOCUMENTS

| | | | |
|---|---|---|---|
| 7,095,619 B2* | 8/2006 | Panella | H05K 1/0262 361/760 |
| 9,101,068 B2* | 8/2015 | Yun | H01L 23/49827 |
| 9,368,450 B1* | 6/2016 | Gu | H01L 23/5385 |
| 9,640,282 B1* | 5/2017 | Chen | G11C 29/1201 |
| 11,088,123 B1 | 8/2021 | Azeroual et al. | |
| 2001/0046724 A1 | 11/2001 | Stephenson et al. | |
| 2001/0046742 A1 | 11/2001 | Jeng | |
| 2003/0197285 A1 | 10/2003 | Strandberg et al. | |
| 2003/0222282 A1 | 12/2003 | Fjelstad et al. | |
| 2006/0091507 A1 | 5/2006 | Fjelstad et al. | |
| 2007/0108581 A1* | 5/2007 | Shim | H01L 23/3128 257/686 |
| 2009/0197436 A1 | 8/2009 | Trobough | |
| 2009/0321939 A1 | 12/2009 | Chandrasekaran | |
| 2009/0325415 A1* | 12/2009 | Brist | H05K 7/1069 439/330 |
| 2010/0065948 A1 | 3/2010 | Bae et al. | |
| 2010/0066393 A1* | 3/2010 | Bottoms | G01R 1/06711 324/755.05 |
| 2011/0042824 A1 | 2/2011 | Koide | |
| 2013/0168854 A1 | 7/2013 | Karikalan et al. | |
| 2014/0117552 A1 | 5/2014 | Qian et al. | |
| 2014/0217571 A1* | 8/2014 | Ganesan | H01B 7/04 257/693 |
| 2014/0273641 A1 | 9/2014 | Light et al. | |
| 2015/0118870 A1* | 4/2015 | Swaminathan | H05K 7/10 439/65 |
| 2015/0171015 A1* | 6/2015 | Mahajan | H01L 21/568 257/712 |
| 2016/0050743 A1* | 2/2016 | Taguchi | H05K 1/0203 361/720 |
| 2016/0099197 A1 | 4/2016 | Uematsu et al. | |
| 2016/0240949 A1 | 8/2016 | Ganesan et al. | |
| 2016/0365660 A1 | 12/2016 | Annis et al. | |
| 2017/0092621 A1* | 3/2017 | Das | H01L 23/481 |
| 2018/0076171 A1* | 3/2018 | Singh | H01L 23/13 |
| 2019/0051587 A1 | 2/2019 | Azeroual et al. | |
| 2019/0103358 A1 | 4/2019 | Goh et al. | |
| 2019/0244903 A1 | 8/2019 | Azeroual et al. | |
| 2020/0243451 A1 | 7/2020 | Frantz et al. | |
| 2021/0111141 A1 | 4/2021 | Sauter et al. | |

OTHER PUBLICATIONS

Examination Opinion in Taiwanese Patent Application No. 108103745, dated Jan. 9, 2020, with English translation (8 pages).

* cited by examiner

PCB MODULE ON PACKAGE

INCORPORATION BY REFERENCE

This present disclosure claims the benefit of U.S. Provisional Application No. 62/625,808, "MODULE ON PACKAGE (MOP)" filed on Feb. 2, 2018, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A printed circuit board (PCB) is generally formed by one or more patterned copper layers that are laminated onto and/or between non-conductive sheet layers. The PCB mechanically supports and electrically connects electronic components, such as integrated circuit (IC) packages, resistors, diodes, capacitors, transistors, and the like using the patterned copper layers.

SUMMARY

Aspects of the disclosure provide a printed circuit board (PCB) system that includes an integrated circuit (IC) package, a first PCB and a PCB module. The IC package has a package substrate and an IC chip that is coupled to a top surface of the package substrate. The first PCB is configured to electrically couple with first contact structures that are disposed on a bottom surface of the package substrate. The PCB module includes a second PCB and one or more electronic components electrically coupled to the second PCB. The PCB module is configured to electrically couple with second contact structures that are disposed on the top surface of the package substrate.

In an example, the second contact structures are disposed on the top surface of the package substrate in a peripheral area surrounding the IC chip.

In an embodiment, the PCB system includes an interposer that interconnects the PCB module with the second contact structures disposed on the top surface of the package substrate. In an example, the interposer is configured to provide compression contacts on at least one side of the interposer. For example, the PCB system includes a force component configured to apply compression force to the first PCB and the PCB module to interconnect the PCB module with the second contact structures of the IC package via the interposer.

According to an aspect of the disclosure, a power supply is provided from the first PCB to the IC package via a first contact structure among the first contact structures on the bottom surface of the package substrate. The power supply is further provided from the IC package to the PCB module via a second contact structure among the second contact structures on the top surface of the package substrate.

In an example, the second contact structures have a different density from the first contact structures. For example, the second contact structures have a higher density than the first contact structures.

In another example, a distance between the first PCB and the second PCB is less than a thickness of the IC package.

Aspects of the disclosure provide a method for fabricating a PCB system. The method includes mounting an integrated circuit (IC) package to a first PCB to electrically couple first contact structures on a bottom surface of a package substrate of the IC package to traces on the first PCB. Then, the method includes fastening a PCB module with the IC package and the first PCB. The PCB module includes a second PCB and one or more electronic components electrically coupled to the second PCB. Then, traces on the second PCB are electrically coupled to second contact structures on a top surface of the package substrate.

Aspects of the disclosure also provide a printed circuit board (PCB) module. The PCB module includes a PCB substrate configured to have a first surface and a second surface being opposite to the first surface. The PCB module includes electronic components mounted on the first surface of the PCB substrate, and includes a contact interface formed on the second surface of the PCB substrate to couple an integrated circuit (IC) package having first contact structures disposed on a bottom surface of a package substrate and second contact structures disposed on a top surface of the package substrate.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Aspects of the disclosure provide a printed circuit board (PCB) system that includes at least a first PCB and a second PCB. At least the second PCB is configured as a PCB module. As used in this disclosure, PCB module refers to a PCB substrate to which an integrated circuit (IC), or other electronic component, is suitably coupled to the PCB substrate. In accordance with an embodiment, ICs are not attached directly to a PCB, but rather the ICs are packaged in an IC package that in turn is coupled to the PCB. The IC package includes a package substrate for mechanical support and to improve electrical connectivity for one or more IC chips that are included in the IC package. In an embodiment, IC chips that are coupled to the package substrate are also encapsulated to form the IC package. The package substrate has a first surface (also referred to as a bottom surface) and a second surface (also referred to as a top surface) that is opposite to the first surface. The IC package includes first contact structures, such as contact pads, solder balls, and the like, that are formed on the first surface, for instance the bottom surface, of the package substrate, and further includes second contact structures that are formed on the second surface of the package substrate, for instance the top surface. The IC package is electrically connected with the first PCB via the first contact structures on the first surface of the IC package, and the IC package is electrically connected to the PCB module via second contact structures on the second surface of the IC package. In some embodiments, an interposer is used to couple, for example, the PCB module and the second contact structures of the IC package.

Figure 1A:
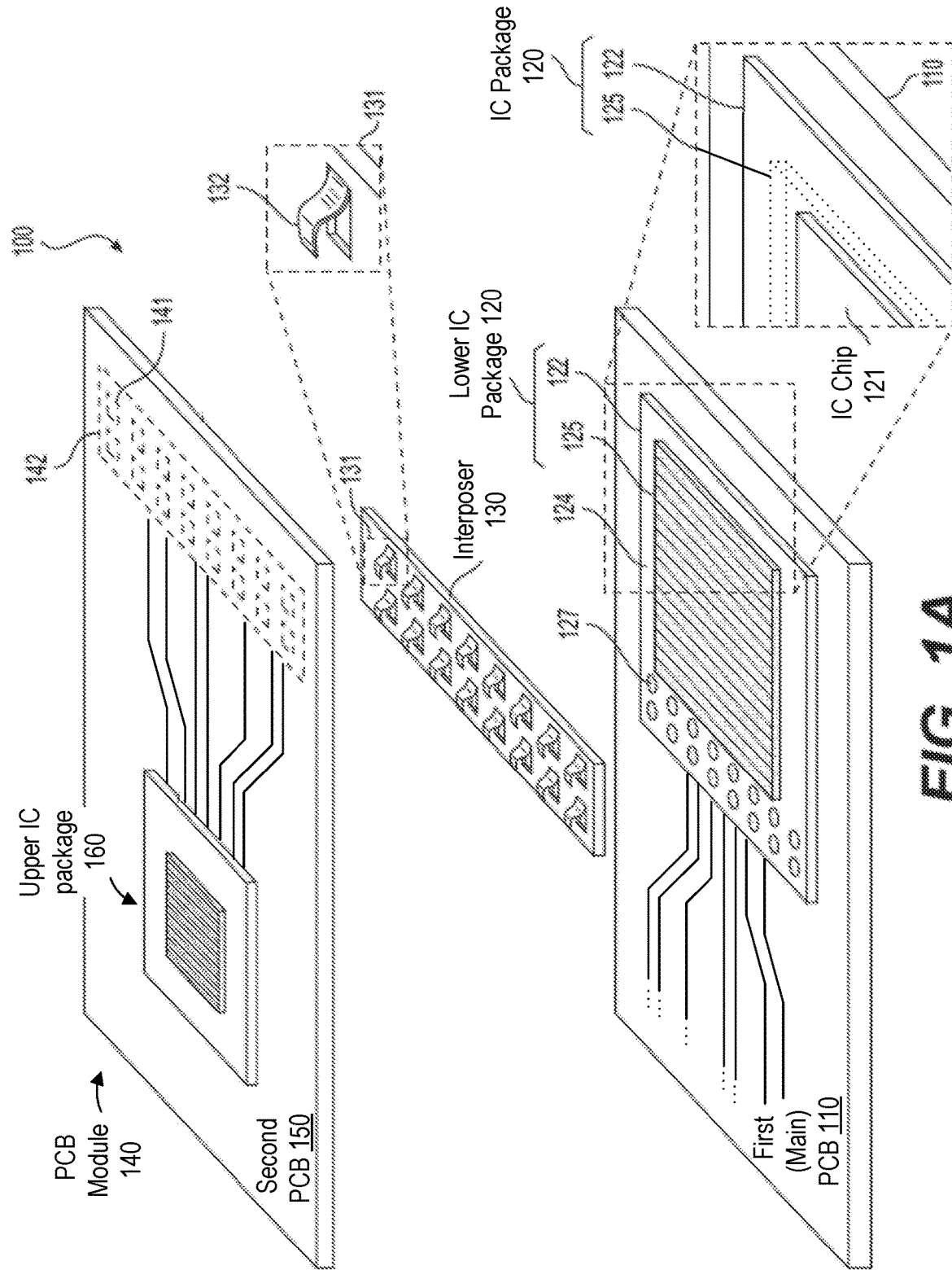
FIGS. 1A-1C show a printed circuit board (PCB) system 100 according to an embodiment of the disclosure.
Figure 1B:
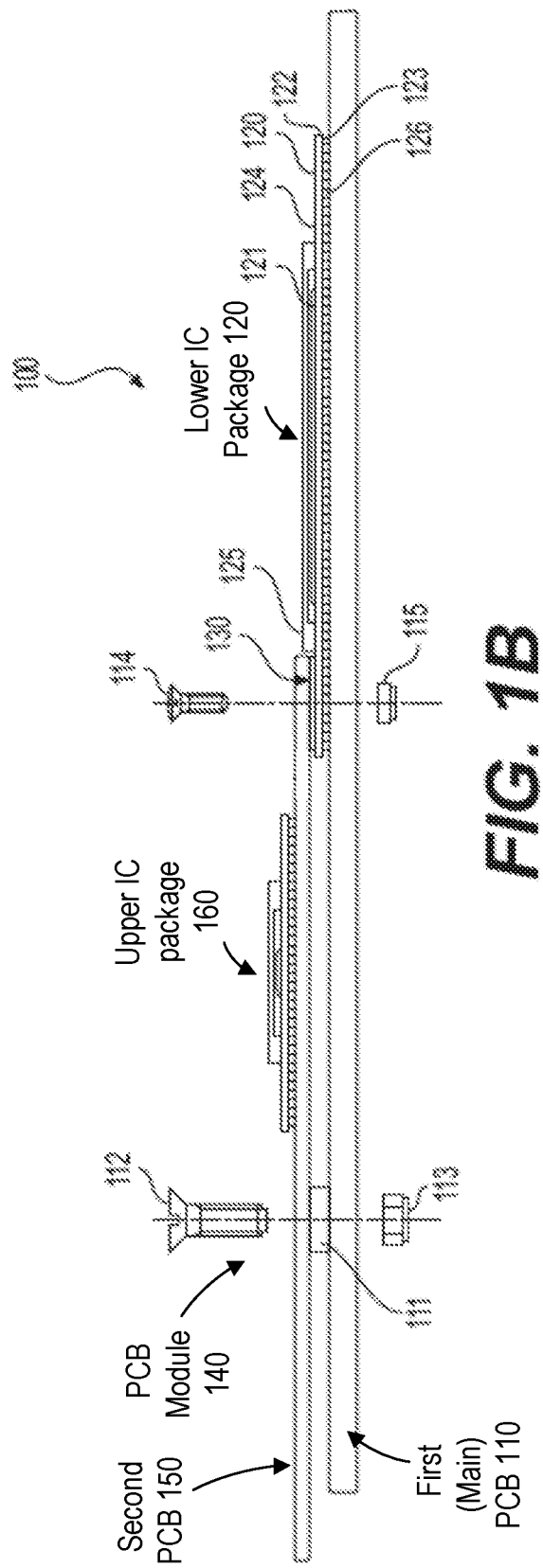
Figure 1C:
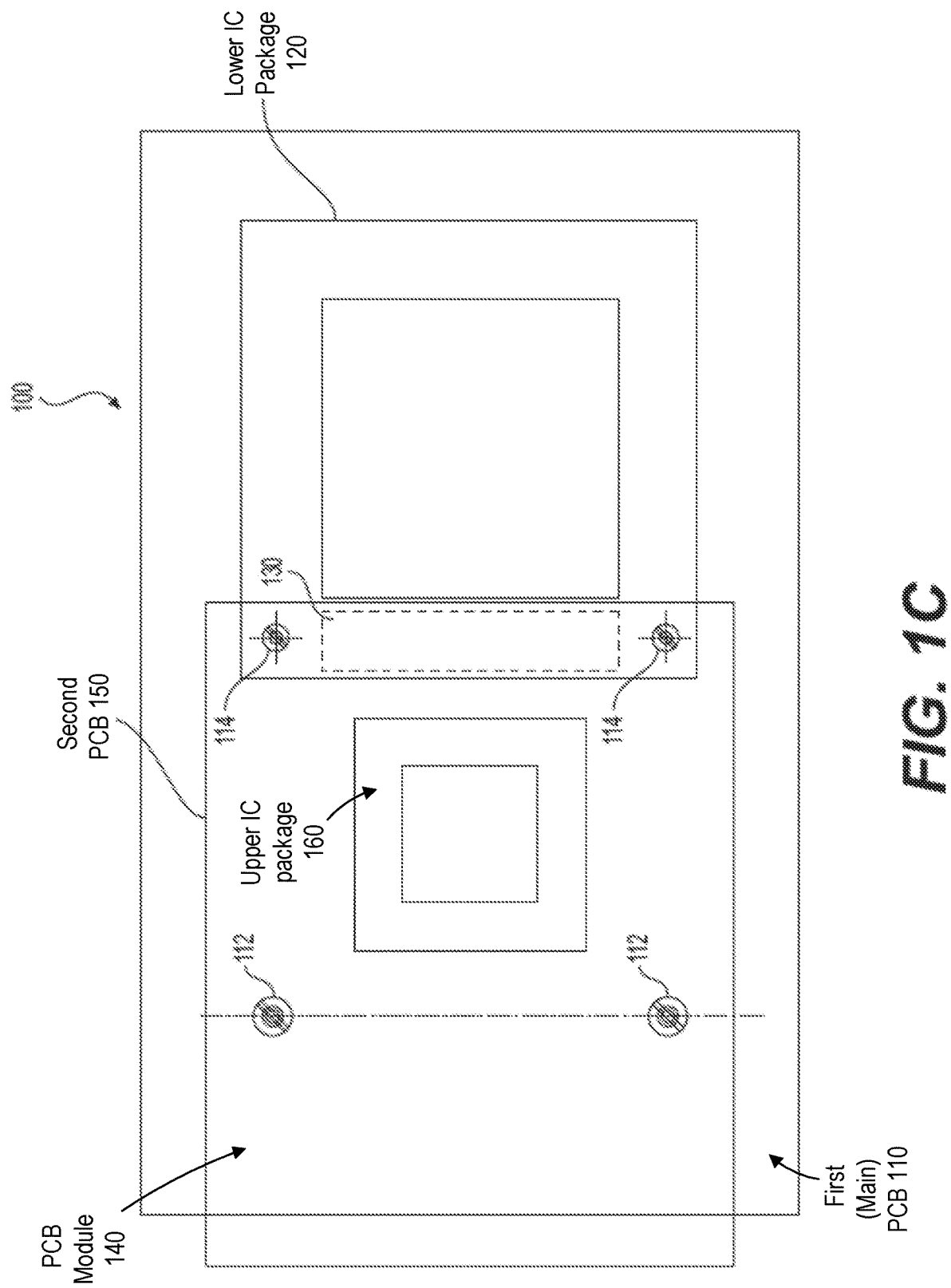

FIGS. 1A-1C show different views of a PCB system 100 according to some embodiments of the disclosure. FIG. 1A shows a perspective view of the PCB system 100, FIG. 1B shows a cross-sectional view of the PCB system 100, and FIG. 1C shows a top view of PCB system 100. The PCB system 100 seen in FIG. 1A includes a first PCB 110 that is also referred to as a main PCB, a PCB module 140 that is also referred to as a module on package when coupled to an IC package 120 that is also referred to as a lower IC package. The IC package 120 encapsulates one or more IC chips, such as an IC chip 121 that is encapsulated in the IC package 120, and when coupled to the first PCB 110 forms a main PCB module. The IC package 120 includes contacts that are electrically connected to either the first PCB 110 or the PCB module 140.

The IC package 120 includes a package substrate 122 that has a first surface 123 (also referred to as bottom surface) and a second surface 124 (also referred to as top surface) that is opposite to the first surface 123. The package substrate 122 is made for example of suitable insulating material (also referred to as dielectric material), such as an epoxy based laminate substrate, a resin-based Bismaleimide-Triazine (BT) substrate, and the like. The package substrate 122 is relatively rigid to provide mechanical support to the IC chip 121. The IC chip 121 is disposed on a surface, such as the second surface 124 of the package substrate 122. Further, in some examples, the IC package 120 includes a metal cover 125 that covers the IC chip 121, for example to protect IC chip 121 and to aid in rapid heat dissipation during operation when the IC chip 121 is powered on, in an embodiment. FIG. 1A shows a close up view when the metal cover 125 is open, and the IC chip 121 is exposed.

The package substrate 122 also provides electrical support for the IC chip 121, such as electrical connection for the IC chip to facilitate coupling of the IC chip to a PCB. In some examples, the package substrate 122 includes multiple layers of metal traces, such as copper wires, and the like with the insulating material in between. The metal traces on the different layers are connected by conductive vias in various embodiments. Further, contact structures are formed on both the first surface 123 and the second surface 124 to electrically interface the IC chip 121 in the IC package 120 to electronic components that are external to the IC package 120, such as the first PCB 110 and the PCB module 140, and the like.

The IC chip 121 can be any suitable integrated circuit chip, such as for example an integrated circuit processor, controller, transceiver, switching device, system on chip and the like. The IC chip 121 includes various circuits for providing computing and/or processing functionalities. In some examples, the IC chip 121 receives suitable signals, such as analog signals, digital signals, control signals, data signals and the like, from components that are out of the IC package 120, and processes the received signals. In some examples, the IC chip 121 generates suitable signals, such as analog signals, digital signals, control signals, data signals, and the like, and outputs the generated signals to the components that are out of the IC package 120.

In an embodiment, the IC package 120 is used in a high speed network switch equipment for packet switching. For example, the IC chip 121 includes a core circuit for packet processing, and peripheral circuits for interface (input/output) processing, such as receiving and/or transmitting signals carrying packets. In an example, the IC chip 121 includes one or more packet processors configured to perform packet processing, including but not limited to packet forwarding. The IC chip 121 further includes interface circuits, such as modulation/demodulation circuits, memory circuit for queuing packets, and the like. In an example, the IC chip 121 includes Serializer/Deserializer (SERDES) configured to convert data between serial data and parallel data. Further, in an example, the IC chip 121 includes modulation/demodulation circuits of a suitable modulation technique, such as pulse-amplitude modulation (PAM)-4, PAM-8, and the like. In addition, in an example, the IC chip 121 includes encoding/decoding circuits of a suitable coding technique, such as non-return-to-zero (NRZ), non-return-to-zero-inverted (NRZI), return-to-zero (RZ), and the like.

The package substrate 122 provides interconnects from the inputs/outputs of the IC chip 121 to the contact structures that are formed on the first surface 123 and the second surface 124 of the IC package 120. In an example, the IC chip 121 is a flip chip. The IC chip 121 includes input/output (I/O) pads (not shown) that are electrically connected to internal circuits that are formed on the IC chip 121. Then, solder bumps are deposited on the I/O pads by suitable manufacturing process to form bump-out structures on the surface of the flip chip. The second surface 124 of the package substrate 122 includes solder bumps (not shown) that match the bump-out structures on the IC chip 121. In an example, the IC chip 121 is disposed on the second surface 124, such that the bump-out structures on the IC chip 121 are aligned with the solder bumps on the second surface 124 of the package substrate 122. Then, a reflow process is performed to form connections of the bump-out structures and the solder bumps.

It is noted that, in another example, the IC chip 121 can be wire-bonded to form electrical connections with the package substrate 122.

In the example shown in FIGS. 1A-1C, the package substrate 122 includes first contact structures 126 formed on the first surface 123 and second contact structures 127 formed on the second surface 124. Further, the package substrate 122 includes metal traces (not shown) that electrically connect the solder bumps to the first contact structures 126 and the second contact structures 127.

According to an aspect of the disclosure, the second contact structures 127 and the IC chip 121 are disposed on the same surface side of the package substrate 122. In some embodiments, the second contact structures 127 are disposed at a peripheral area that surrounds the IC chip 121, such as the area between the metal cover 125 for the IC chip 121 and an edge of the second surface 124.

The first contact structures 126 and the second contact structures 127 can be any suitable contact structures. In an embodiment, the IC package 120 is a ball grid array (BGA) package, and each of the first and second contact structures 126 and 127 includes a solder pad and a solder ball that is deposited on the solder pad. In another embodiment, the IC package 120 is a land grid array (LGA) package, and each of the first and second contact structures 126 and 127 includes a solder pad. In another embodiment, the IC package 120 is a pin grid array (PGA) package, and each of the first and second contact structures 126 and 127 includes a pin.

It is noted that, in some embodiments, the second contact structures 127 are implemented using a different technology from the first contact structures 126. For example, the first contact structures 126 are implemented using solder pads and solder balls, and the second contact structures 127 are implemented using solely solder pads.

In the example of FIG. 1A, the second contact structures 127 are shown as circles. In some examples, the first and second contact structures 126 and 127 have other suitable shapes, such as a sphere, a square, a pin shape, and the like.

According to an aspect of the disclosure, the first contact structures 126 and the second contact structures 127 are respectively configured to enable electrical connections to other components using suitable techniques. In an example, the first contact structures 126 are configured to enable electrical connections to the first PCB 110 using soldering techniques. For example, when the IC package 120 is mounted on the first PCB 110, a solder reflow process is performed to form solder joints, thus the first contact structures 126 are connected to corresponding contact structures on the first PCB 110.

Further, in an embodiment, the second contact structures 127 are configured to enable electrical connections to the PCB module 140 via an interposer 130. Specifically, the PCB module 140 includes a contact interface 142 at a surface facing the interposer 130 and the first PCB 110 as shown by dash-lines in FIG. 1A. The contact interface 142 includes a plurality of contact structures 141 corresponding to the second contact structures 127.

Further, the interposer 130 includes a plurality of interconnection structures 131 to interconnect the corresponding contact structures 141 of the PCB module 140 and the second contact structures 127 of the IC package 120. Each interconnection structure 131 is configured to make a first connection with a second contact structure 127 and a second connection with a contact structure 141 using suitable techniques. In an embodiment, each interconnection structure 131 is a dual compression structure that uses compression connection for the first connection and the second connection. In another embodiment, each interconnection structure 131 is a single compression structure with a solder ball that uses the solder ball for the first connection and compression connection for the second connection.

FIG. 1A includes a close up view of one side of an interconnection structure 131 that is configured for compression connection. The interconnection structure 131 includes a metal tongue 132 that protrudes the surface of the interposer 130, and the metal tongue 132 can be pushed into the surface under a compression force.

In an embodiment, the PCB system 100 includes a force generation component that can apply a compression force to let the interposer 130 to interconnect the PCB module 140 with the second contact structures 127. For example, the first PCB 110 and the PCB module 140 are designed and fabricated with holes that can be aligned for disposing bolts. After the IC package 120 is mounted on the first PCB 110, the interposer 130 and the PCB module 140 are aligned and stacked. It is noted that suitable spacers 111 can inserted to level the PCB module 140 on the first PCB 110. Then bolts 112 and 114 are fastened to corresponding nuts 113 and 115 to lock the first PCB 110, the interposer 130 and the PCB module 140 in place, and to apply compression force to cause the interposer 130 to interconnect the contact structures 141 of the PCB module 140 with the second contact structures 127 of the IC package 120.

According to an aspect of the disclosure, the PCB module 140 includes a PCB 160 (also referred to as a second PCB) and electronic components, such as resistors, diodes, capacitors, transistors, integrated circuit (IC) packages, and the like, that are already mounted on the second PCB 150. The first PCB 110 and the second PCB 150 in the PCB module 140 are similarly configured. For example, the first PCB 110 and the second PCB 150 respectively include multiple layers of metal traces, such as copper wires, and the like disposed on a multilayered sandwich structure of dielectric material. In some examples, the first PCB 110 and the second PCB 150 have different number of metal layers. For example, the first PCB 110 has more metal layers and is the main PCB for the PCB system 100. The second PCB 150 provides additional electrical connection supports for any suitable electronic components, such as integrated circuit (IC) packages, resistors, diodes, capacitors, transistors, and the like can be mounted on the second PCB 150 to form the PCB module 140.

In the FIGS. 1A-1C example, a regular IC package 160 (also referred to as an upper IC package) is mounted on an upper surface (e.g., opposite to the surface that facing the first PCB 110) of the second PCB 150, forming the PCB module 140. The regular (upper) IC package 160 includes contact structures on one side of the package substrate, not both sides of the package substrate as with the lower IC package 120. The upper IC package 160 is an example of an electronic component mounted on the second PCB 150, which was discussed above.

In the FIGS. 1A-1C example, a regular IC package 150 (also referred to as an upper package) is mounted on an upper surface (e.g., opposite to the surface that facing the first PCB 110) of the second PCB, forming a PCB module 140. The regular IC package 150 includes contact structures on one side of the package substrate, not both sides of the package substrate.

According to an aspect of the disclosure, the interposer 130 has a high density and low profile. In an example, the interposer 130 has a pitch grid of 0.80 mm (e.g., smaller than solder ball pitch), and a body height of 1 mm (0.33 mm height for shortest signal path). Thus, in an example, the distance between the two PCB modules 110 and 140 is less than the height of the IC package 120.

In an embodiment, the pitch grid of the interposer 130 is smaller than solder ball pitch requirement. In an example, the density of the second contact structures 127 is higher than the density of the first contact structures 126. The IC package 120 uses both sides of the package substrate to provide inputs/outputs (IOs), and can be implemented with a reduced package size.

In another embodiment, the electrical connections from the second contact structures 127 of the lower IC package 120 to, for example the upper IC package 160, are through the interposer 130 that provides a relatively shorter signal path compared to other interconnection techniques, such as package plated through hole (PTH) via, PCB PTH, PCB, and the like. Thus the electrical connections from the second contact structures 127 to the upper IC package 160 via the interposer 130 have less attenuation than the other interconnection techniques, and thus can be used for high speed signal transmission, such as (but not limited to) over 50 Gbps data rate.

In another embodiment, a power supply is provided from the first PCB 110 to the PCB module 140 via the IC package 120 (e.g., via one of the first contact structures 126, some metal traces in the packet substrate 122, and one of the second contact structures 127), and the interposer 130.

Figure 2:
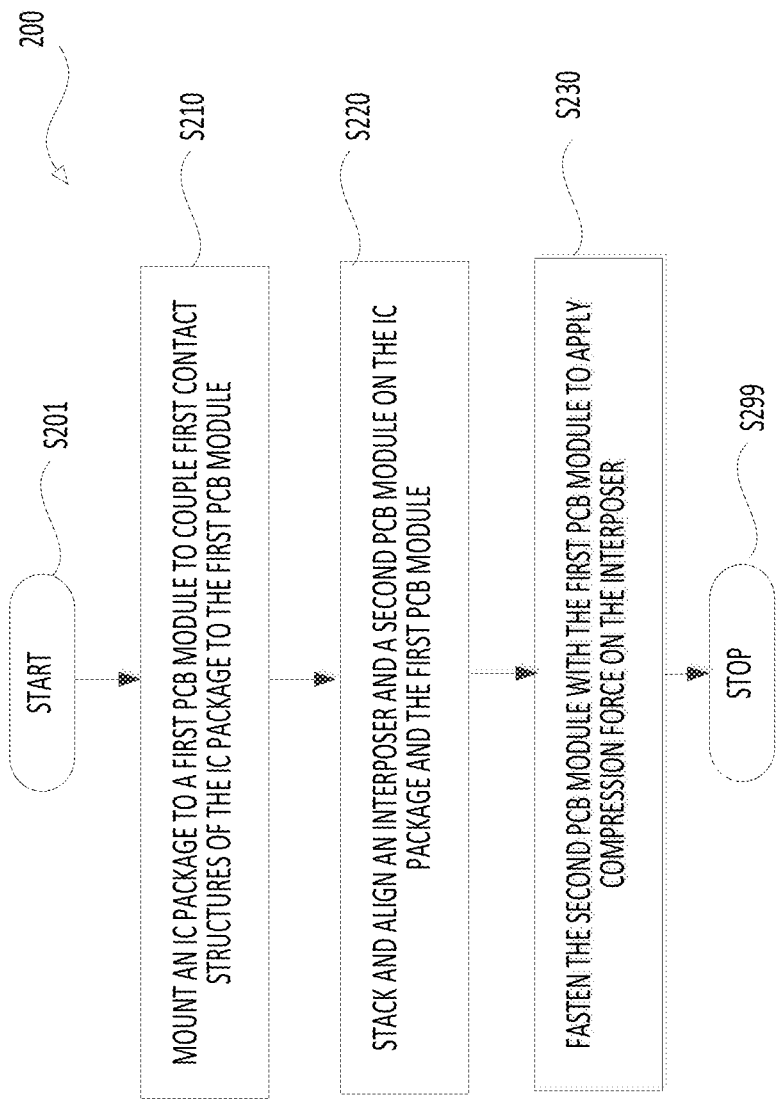
FIG. 2 shows a flow chart outlining a process example 200 for according to an embodiment of the disclosure.

FIG. 2 shows a flow chart outlining a process example 200 according to an embodiment of the disclosure. In an example, the process 200 is used to form a PCB system, such as the PCB system 100. The process starts at S201, and proceeds to S210.

At S210, a lower IC package is mounted to a first PCB by coupling first contact structures of the lower IC package to the first PCB and thereby form a first PCB module. For example, the lower IC package 120 is mounted on the first PCB 110. Specifically, the first contact structures 126 are aligned with corresponding contact structures on the first PCB 110 and mounted on the first PCB 110. In an example, a solder reflow process is performed to form solder joints that form an electrical connection between the lower IC package and the first PCB 110, with the contact structures 126 being connected to the corresponding contact structures on the first PCB 110.

At S220, an interposer and a second PCB module are stacked and aligned with the IC package of the first PCB module. In an example, the upper PCB module 140 is formed previously by mounting the upper IC package 160 on the second PCB 150. The interposer 130 is disposed on and aligned with the second contact structures 127. The PCB module 140 is disposed on the interposer 130, and the contact structures 141 are aligned with opposing interconnection structures 131 of the interposer 130. Spacers 111 can be inserted to level the PCB module 140 on the first PCB 110 in some embodiments.

At S230, the second PCB module is fastened with the first PCB module to apply compression force on the interposer. For example, the first PCB 110 and the second PCB 150 in the PCB module 140 are designed and fabricated with holes that can be aligned for disposing bolts or other suitable fasteners. Then bolts 112 and 114 are fastened to corresponding nuts 113 and 115 to lock the first PCB 110, the interposer 130 and the PCB module 140 in place, and to apply compression force to cause the interposer 130 to interconnect the contact structures 141 of the PCB module 140 with the second contact structures 127 of the IC package 120. Then, the process proceeds to S299 and terminates.

It is noted that, in various embodiments, other suitable process steps can be performed before the process 200, between steps in the process 200 and/or after the process 200 for semiconductor device fabrication. In an example, the upper IC package 160 is mounted on the second PCB 150 to form the PCB module 140 before S220.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A printed circuit board (PCB) system, comprising:
   a first integrated circuit (IC) package having a package substrate and an IC chip that is coupled to a top surface of the package substrate, the package substrate having an edge;
   a first PCB configured to electrically couple with first contact structures that are disposed on a bottom surface of the package substrate, the first PCB having a first number of layers;
   a PCB module including a second PCB and one or more electronic components electrically coupled to the second PCB, the one or more electronic components including a second IC package mounted on the second PCB, wherein the second PCB includes a second number of layers that is less than the first number of layers, the PCB module being configured to electrically couple with second contact structures that are disposed on the top surface of the package substrate, the second PCB extending beyond the edge of the package substrate and over the first PCB; and
   a plurality of compression interconnection structures configured to interconnect the PCB module with the second contact structures disposed on the top surface of the package substrate, the plurality of compression interconnection structures configured to form contacts maintained by a compression force, on at least one side of the compression interconnection structures, between the second contact structures that are disposed on the top surface of the package substrate and corresponding contact structures on the PCB module.

2. The PCB system of claim 1, wherein:
   the second contact structures are disposed on the top surface of the package substrate in an area between the IC chip and the edge of the package substrate.

3. The PCB system of claim 1, wherein:
   the plurality of compression structures are disposed in an interposer configured to interconnect the PCB module with the second contact structures disposed on the top surface of the package substrate.

4. The PCB system of claim 3, wherein the interposer is configured to provide the compression contacts on at least one side of the interposer.

5. The PCB system of claim 4, further comprising:
   a force component configured to apply compression force to the first PCB and the PCB module to interconnect the PCB module with the second contact structures of the first IC package via the interposer.

6. The PCB system of claim 1, wherein:
   a power supply is provided from the first PCB to the first IC package via a first contact structure among the first contact structures on the bottom surface of the package substrate, the power supply being further provided from the first IC package to the PCB module via a second contact structure among the second contact structures on the top surface of the package substrate.

7. The PCB system of claim 1, wherein the second contact structures have a different density from the first contact structures.

8. The PCB system of claim 7, wherein the second contact structures have a higher density than the first contact structures.

9. The PCB system of claim 1, wherein
   a distance between the first PCB and the second PCB is less than a thickness of the first IC package.

10. A method, comprising:
    mounting a first integrated circuit (IC) package to a first PCB to electrically couple first contact structures on a bottom surface of a package substrate of the first IC package to traces on the first PCB, the first PCB including a first number of layers, the package substrate having an edge; and
    fastening a PCB module with the first IC package and the first PCB, the PCB module including a second PCB having a second number of layers that is less than the first number of layers and one or more electronic components electrically coupled to the second PCB, the one or more electronic components including a second IC package mounted on the second PCB, wherein traces on the second PCB are electrically coupled to second contact structures on a top surface of the package substrate via a plurality of compression interconnection structures configured to form contacts maintained by a compression force, on at least one side of the compression interconnection structures, between the second contact structures that are disposed on the top surface of the package substrate and corresponding contact structures on a bottom surface of the second PCB, wherein upon fastening of the PCB module with the first IC package and the first PCB, the second PCB extends beyond the edge of the package substrate and over the first PCB.

11. The method of claim 10, wherein fastening the PCB module with the first IC package and the first PCB further comprises:
  disposing an interposer between the PCB module and the second contact structures, the interposer including the plurality of interconnection structures to interconnect the PCB module with the second contact structures disposed on the top surface of the package substrate.

12. The method of claim 11, further comprising:
  applying compression force on the interposer to interconnect the PCB module with the second contact structures of the first IC package.

13. The method of claim 12, further comprising:
  fastening a bolt to apply the compression force.

14. The method of claim 10, further comprising:
  providing a power supply from the first PCB to the PCB module via at least a first contact structure among the first contact structures on the bottom surface of the package substrate and a second contact structure among the second contact structures on the top surface of the package substrate.

15. A printed circuit board (PCB) module configured to electrically couple to a first integrated circuit (IC) package having a package substrate with an edge, the package substrate having first contact structures disposed on a bottom surface of a package substrate and second contact structures disposed on a top surface of the package substrate, the first contact structures disposed on the bottom surface of the package substrate for electrically coupling to a main PCB having a first number of layers, the PCB module comprising:
  a PCB substrate configured to have a first surface and a second surface being opposite to the first surface, the PCB substrate having a second number of layers less than the first number of layers;
  electronic components mounted on the first surface of the PCB substrate, the electronic components including a second IC mounted on the first surface of the PCB substrate; and
  a contact interface formed on the second surface of the PCB substrate, the contact interface having a plurality of third contact structures arranged to couple to the second contact structures disposed on the top surface of the package substrate so that, when the third contact structures are coupled to the second contact structures disposed on the top surface of the package substrate, the PCB substrate extends beyond the edge of the package substrate and over the main PCB, wherein the plurality of third contact structures of the contact interface are arranged to couple with a plurality of compression interconnection structures configured to form contacts maintained by a compression force, on at least one side of the compression interconnection structures, between the second contact structures that are disposed on the top surface of the package substrate and corresponding contact structures on the PCB module.

16. The PCB module of claim 15, wherein the plurality of third contact structures of the contact interface are arranged to couple with the second contact structures disposed in a peripheral area surrounding an IC chip that is coupled on the top surface of the package substrate.

17. The PCB module of claim 15, wherein the plurality of compression structures are disposed in an interposer that interconnects the PCB module with the second contact structures disposed on the top surface of the package substrate.

18. The PCB module of claim 17, wherein the plurality of third contact structures of the contact interface are configured to couple with compression contacts on the interposer.

19. The PCB module of claim 18, wherein:
  the PCB substrate defines a hole structure configured to accept a bolt for fastening to apply compression force on the interposer.

20. The PCB module of claim 17, wherein:
  one of the third contact structures of the contact interface is positioned to accept a power supply that is provided from the second PCB via one of the first contact structures on the bottom surface of the package substrate, and via one of the second contact structures on the top surface of the package substrate.

* * * * *